US008436466B2

(12) United States Patent
Rofougaran et al.

(10) Patent No.: US 8,436,466 B2
(45) **Date of Patent: *May 7, 2013**

(54) METHOD AND SYSTEM FOR INTRA-CHIP WAVEGUIDE COMMUNICATION

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/170,292

(22) Filed: Jun. 28, 2011

(65) Prior Publication Data

US 2011/0316677 A1 Dec. 29, 2011

Related U.S. Application Data

(63) Continuation of application No. 12/191,553, filed on Aug. 14, 2008, now Pat. No. 7,969, 001.

(60) Provisional application No. 61/073,950, filed on Jun. 19, 2008.

(51) Int. Cl.
*H01L 23/525* (2006.01)

(52) U.S. Cl.
USPC .................. 257/728; 257/E23.002; 333/105; 333/108

(58) Field of Classification Search .................. 257/728, 257/E23.002; 333/105, 108
See application file for complete search history.

(56) References Cited

U.S. PATENT DOCUMENTS

| | | | | |
|---|---|---|---|---|
| 4,201,963 | A * | 5/1980 | Welti | 333/106 |
| 4,761,622 | A * | 8/1988 | Cracknell et al. | 333/108 |
| 5,079,507 | A * | 1/1992 | Ishida et al. | 324/645 |
| 5,986,331 | A * | 11/1999 | Letavic et al. | 257/664 |
| 5,990,757 | A | 11/1999 | Tonomura | |
| 6,839,478 | B2 | 1/2005 | Huber | |
| 8,067,810 | B2 * | 11/2011 | Rottenberg et al. | 257/414 |
| 8,274,147 | B2 * | 9/2012 | Rofougaran et al. | 257/728 |
| 2005/0104684 | A1 * | 5/2005 | Wojcik et al. | 333/108 |
| 2009/0315637 | A1 * | 12/2009 | Rofougaran | 333/105 |
| 2009/0318105 | A1 * | 12/2009 | Rofougaran et al. | 455/323 |

* cited by examiner

*Primary Examiner* — Allan R Wilson
(74) *Attorney, Agent, or Firm* — Farjami & Farjami LLP

(57) ABSTRACT

Methods and systems for configuring one or more electrical waveguides in an integrated circuit by adjusting a geometry of the one or more electrical waveguides, and communicating one or more electrical signals between components within the integrated circuit via the one or more electrical waveguides. The geometry of the one or more electrical waveguides may be configured by adjusting a length of the one or more electrical waveguides utilizing switches in the integrated circuit. The switches may include CMOS transistors. The one or more signals may include a microwave signal and a low frequency digital control signal that configures the microwave signal. The electrical waveguides may include metal and/or semiconductor layers deposited on and/or embedded within the integrated circuit.

18 Claims, 3 Drawing Sheets

METHOD AND SYSTEM FOR INTRA-CHIP WAVEGUIDE COMMUNICATION

CROSS-REFERENCE TO RELATED APPLICATIONS/INCORPORATION BY REFERENCE

This application is a continuation of application Ser. No. 12/191,553 filed on Aug. 14, 2008 now U.S. Pat. No. 7,969,001, which makes reference to and claims priority to U.S. Provisional Application Ser. No. 61/073,950, filed on Jun. 19, 2008, which is hereby incorporated herein by reference in its entirety.

This application makes also reference to:

U.S. patent application Ser. No. 12/191,497 filed on Aug. 14, 2008;

U.S. patent application Ser. No. 12/058,423 filed on Mar. 28, 2008; and

U.S. patent application Ser. No. 12/191,605 filed on Aug. 14, 2008.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for intra-chip waveguide communication.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for intra-chip waveguide communication, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for intra-chip waveguide communication. Exemplary aspects of the invention may comprise configuring one or more waveguides in an integrated circuit and communicating one or more signals between components within the integrated circuit via the one or more waveguides. The one or more waveguides may be configured via switches in the integrated circuit by adjusting a length of the one or more waveguides. The one or more signals may comprise a microwave signal and a low frequency control signal that configures the microwave signal. The low frequency control signal may comprise a digital signal. The one or more waveguides may comprise metal layers deposited on the integrated circuit or within the integrated circuit. The one or more waveguides may comprise semiconductor layers deposited on the integrated circuit or embedded within the integrated circuit.

Figure 1:
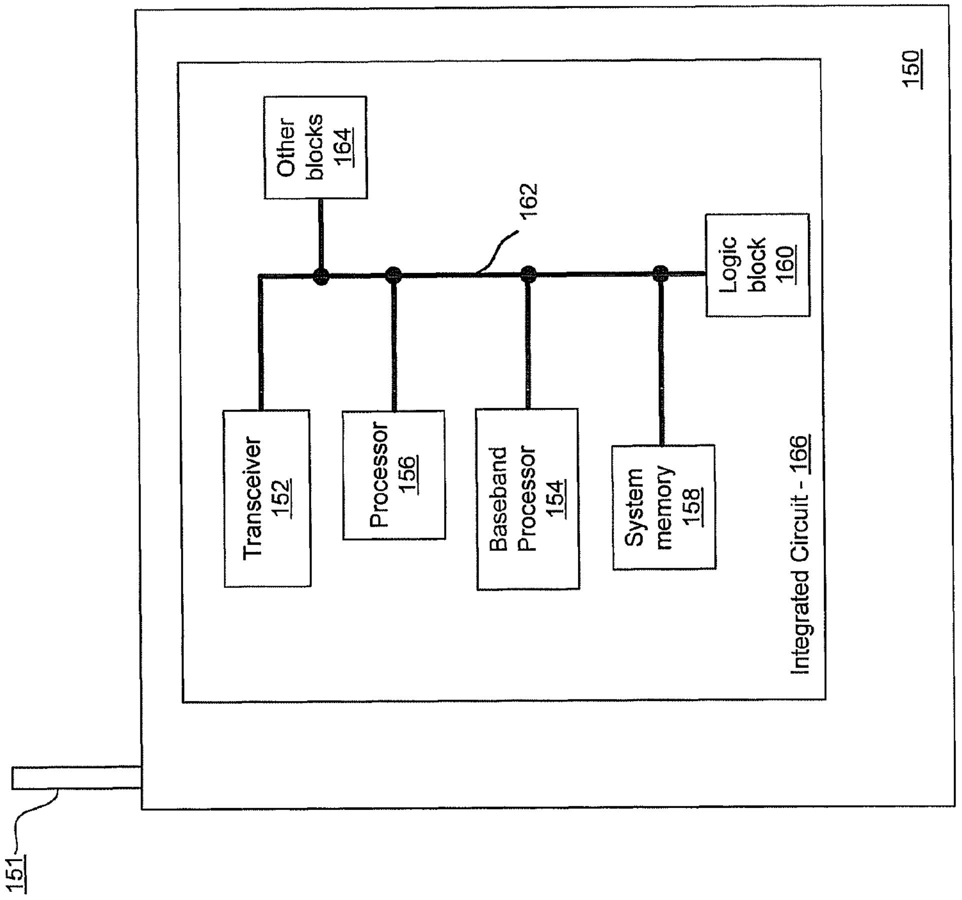
FIG. 1 is a block diagram of an exemplary wireless system, which may be utilized in accordance with an embodiment of the invention.

FIG. 1 is a block diagram of an exemplary wireless system, which may be utilized in accordance with an embodiment of the invention. Referring to FIG. 1, the wireless system 150 may comprise an antenna 151, and an integrated circuit 166. The integrated circuit 166 may comprise a transceiver 152, a baseband processor 154, a processor 156, system memory 158, a logic block 160, a waveguide 162, and other blocks 164. The antenna 151 may be used for reception and/or transmission of RF signals.

The transceiver 152 may comprise suitable logic, circuitry, and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151. Different wireless systems may use different antennas for transmission and reception. The transceiver 152 may be enabled to execute other functions, for example, filtering, coupling, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality transceivers, transmitters and/or receivers. In this regard, the plurality of transceivers, transmitters and/or receivers may enable the wireless system 150 to handle a plurality of wireless protocols and/or standards including cellular, WLAN and PAN.

The waveguide 162 may comprise suitable circuitry, logic and/or code that may enable the communication of electromagnetic signals between devices and/or blocks integrated within the integrated circuit 166. The waveguide 162 may be configured to communicate at a specific frequency, 60 GHz for example, while still allowing low frequency control signals to propagate between devices and/or blocks. The waveguide 162 may be embedded within or deposited on top of the integrated circuit 166, described further with respect to FIG. 2. The invention is not limited to the number of waveguides shown in FIG. 1. Accordingly, any number of waveguides may be integrated within the integrated circuit 166, depending on the space limitations and frequency requirements, for example.

The baseband processor 154 may comprise suitable logic, circuitry, and/or code that may be enabled to process baseband signals for transmission via the transceiver 152 and/or the baseband signals received from the transceiver 152. The processor 156 may be any suitable processor or controller such as a CPU or DSP, or any type of integrated circuit processor. The processor 156 may comprise suitable logic, circuitry, and/or code that may be enabled to control the operations of the transceiver 152 and/or the baseband processor 154. For example, the processor 156 may configure the waveguide 162 to communicate signals at a desired frequency, 60 GHz or greater, for example, and may also communicate lower frequency control signals for configuring and maintaining operations within the wireless system 150. In another embodiment of the invention, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

The system memory 158 may comprise suitable logic, circuitry, and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, and/or code that may enable controlling of various functionalities of the wireless system 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

The other blocks 164 may comprise any other circuitry within the integrated circuit 166 that may enable the operation of the wireless system 150. The other blocks 164 may comprise power handling circuitry, digital signal processors, and input/output circuitry, for example. In an embodiment of the invention, the other blocks 164 may comprise switches, CMOS switches, for example, that may be utilized to configure the waveguide 162. The configuration may comprise adjusting the geometry of the waveguide 162 by switching sections open or closed, for example.

In operation, control and/or data information, which may comprise the programmable parameters, may be transferred from other portions of the wireless system 150, not shown in FIG. 1, to the processor 156. Similarly, the processor 156 may be enabled to transfer control and/or data information, which may include the programmable parameters, to other portions of the wireless system 150, not shown in FIG. 1, which may be part of the wireless system 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. In an embodiment of the invention, the processor 156 may configure the waveguide 162 to communicate signals of a desired frequency between the components of the integrated circuit 166. Additionally, low frequency control signals may also be communicated via the waveguide 162. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

Figure 2:
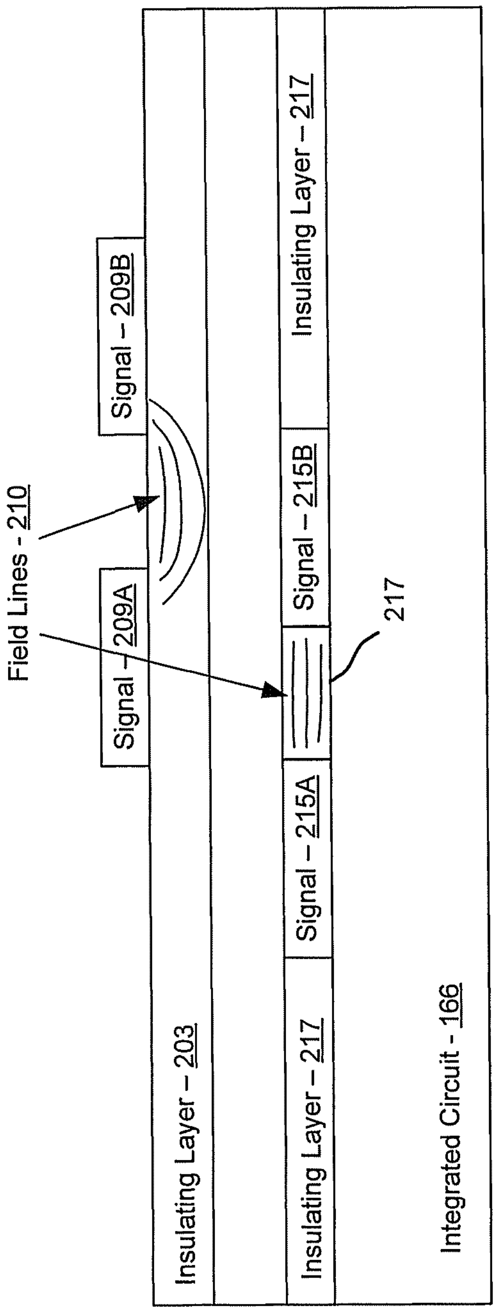
FIG. 2 is a block diagram illustrating a cross-sectional view of an integrated circuit with integrated waveguides, in accordance with an embodiment of the invention.

FIG. 2 is a block diagram illustrating a cross-sectional view of an integrated circuit with integrated waveguides, in accordance with an embodiment of the invention. Referring to FIG. 2, there is shown coplanar waveguides comprising metal layers 209A, 209B, an insulating layer 203 and also metal layers 215A and 215B and an insulating layer 217, and field lines 210. The metal layers 209A/209B and 215A/215B may comprise signal lines for the waveguides, and the electric fields between the metal lines, as indicated by the field lines 210, may be configured by the dielectric constant of the material, or air, between the layers as well as the spacing between them. In the case of the metal layers 215A and 215B, the dielectric constant of the insulating layer 217 may configure the electric field. In another embodiment of the invention, the metal layers 209A/209B and 215A/215B may comprise poly-silicon or other conductive material. The insulating layers 203 and 217 may comprise a high resistance material that may provide electrical isolation between the metal layers 209A, 209B, 215A and 215B.

In operation, one or more signals may be applied across the metal layers 209A and 209B, and/or the metal layers 215A and 215B. The waveguides defined by the metal layers 209A/209B and 215A/215B may enable communication between circuitry within the integrated circuit 166. In this manner, a high frequency signal path may be utilized by multiple blocks within the integrated circuit 166, which may reduce system cost and size by providing a single high frequency communication path between blocks as opposed to multiple signal conductive lines.

In addition, by utilizing a configurable waveguide for communication as opposed to multiple wire traces, communication parameters, such as signal loss and bandwidth, for example, may be optimized for a desired frequency of communication. The waveguides may be configured by switches within the integrated circuit, such as CMOS switches, for example, and may comprise changing a length of the metal layers 209A/209B and 215A/215B.

Figure 3:
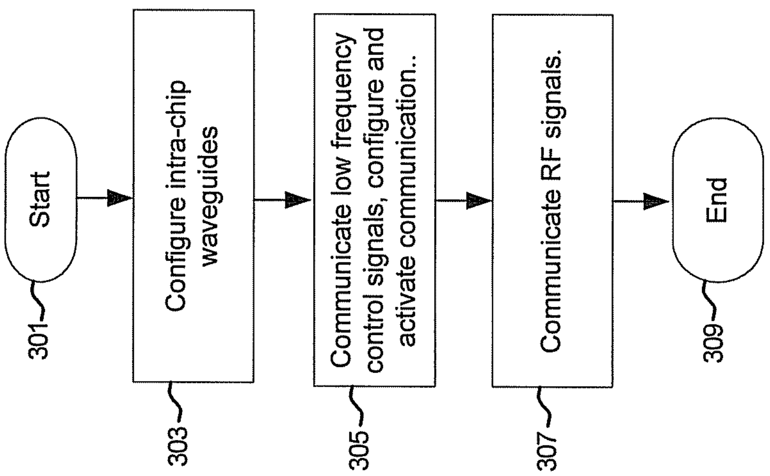
FIG. 3. is a block diagram illustrating exemplary steps for intra-chip communication via waveguides, in accordance with an embodiment of the invention.

FIG. 3. is a block diagram illustrating exemplary steps for intra-chip communication via waveguides, in accordance with an embodiment of the invention. In step 303, after start step 301, one or more integrated circuit waveguides may be configured for desired signal transmission frequency or frequencies. In step 305, low frequency control signals may be communicated to configure, activate, and maintain RF signal communication within the integrated circuit 166, followed by step 307, where an RF signal may be communicated via the waveguide comprising the metal layers 209A/209B and/or 215A/215B, followed end step 309.

In an embodiment of the invention, a method and system are disclosed for intra-chip waveguide communication. Exemplary aspects of the invention may comprise configuring one or more waveguides 162 in an integrated circuit 166 and communicating one or more signals between blocks 152, 154, 156, 158, 160, and 164 within the integrated circuit 166 via the one or more waveguides 162. The one or more waveguides 162 may be configured via switches in the integrated circuit 166 by adjusting a length of the one or more waveguides 162. The one or more signals may comprise a microwave signal and a low frequency control signal that configures the microwave signal. The low frequency control signal may comprise a digital signal. The one or more waveguides 162 may comprise metal layers 209A, 209B, 215A, and 215B deposited on the integrated circuit 166 or within the integrated circuit 166. The one or more waveguides 162 may comprise semiconductor layers deposited on the integrated circuit 166 or embedded within the integrated circuit 166.

Certain embodiments of the invention may comprise a machine-readable storage having stored thereon, a computer program having at least one code section for intra-chip waveguide communication, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for communication, the method comprising:
configuring one or more electrical waveguides in an integrated circuit by adjusting a geometry of said one or more electrical waveguides; and
communicating one or more electrical signals between components within said integrated circuit via said one or more electrical waveguides.

2. The method according to claim 1, comprising configuring said geometry of said one or more electrical waveguides utilizing switches in said integrated circuit.

3. The method according to claim 2, wherein said switches comprise CMOS transistors.

4. The method according to claim 1, wherein said one or more signals comprises a microwave signal.

5. The method according to claim 4, wherein said one or more signals comprises a low frequency control signal that configures said microwave signal.

6. The method according to claim 5, wherein said low frequency control signal comprises a digital signal.

7. The method according to claim 1, wherein said one or more electrical waveguides comprise metal layers deposited on said integrated circuit.

8. The method according to claim 1, wherein said one or more electrical waveguides comprise metal layers embedded within said integrated circuit.

9. The method according to claim 1, wherein said one or more waveguides comprise semiconductor layers deposited on and/or embedded in said integrated circuit.

10. A system for communication, the system comprising:
one or more circuits in a wireless mobile communication device, said one or more circuits are operable to:
configure one or more electrical waveguides in an integrated circuit by adjusting a geometry of said one or more electrical waveguides; and
communicate one or more electrical signals between components within said integrated circuit via said one or more electrical waveguides.

11. The system according to claim 10, wherein said one or more circuits are operable to configure said geometry of said one or more electrical waveguides utilizing switches in said integrated circuit.

12. The system according to claim 11, wherein said switches comprise CMOS transistors.

13. The system according to claim 10, wherein said one or more signals comprises a microwave signal.

14. The system according to claim 13, wherein said one or more signals comprises a low frequency control signal that configures said microwave signal.

15. The system according to claim 14, wherein said low frequency control signal comprises a digital signal.

16. The system according to claim 10, wherein said one or more electrical waveguides comprise metal layers deposited on and/or embedded within said integrated circuit.

17. The system according to claim 10, wherein said one or more waveguides comprise semiconductor layers deposited on and/or embedded in said integrated circuit.

18. A system for communication, the system comprising: a wireless mobile communication device that comprises one or more coplanar waveguides integrated in an integrated circuit, said one or more coplanar waveguides are operable to communicate high frequency signals between electrical components integrated in said integrated circuit, wherein a frequency of said high frequency signals is configured by dynamically configuring a geometry of said one or more coplanar waveguides.

* * * * *